(12) United States Patent
Tanaka

(10) Patent No.: US 6,407,343 B1
(45) Date of Patent: Jun. 18, 2002

(54) MULTILAYER WIRING BOARD

(75) Inventor: Shinji Tanaka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/615,942

(22) Filed: Jul. 13, 2000

(30) Foreign Application Priority Data

Jul. 16, 1999 (JP) .......................................... 11-203756

(51) Int. Cl.[7] .......................... H05K 1/11; H05K 1/03; H01R 12/04
(52) U.S. Cl. ....................... 174/261; 174/255; 174/262; 174/264; 361/792; 361/794; 361/803
(58) Field of Search ................................ 174/261, 255, 174/256, 259, 260, 262, 263, 264, 266; 361/760, 746, 777, 778, 780, 792, 793, 794, 795, 803; 428/209, 901

(56) References Cited

U.S. PATENT DOCUMENTS

| | | | | |
|---|---|---|---|---|
| 4,524,239 A | * | 6/1985 | Rouge | 174/254 |
| 4,675,789 A | * | 6/1987 | Kuwabara et al. | 361/794 |
| 5,288,949 A | * | 2/1994 | Crafts | 174/250 |
| 5,496,971 A | * | 3/1996 | Moriizumi et al. | 174/255 |
| 5,519,176 A | * | 5/1996 | Goodman et al. | 174/255 |
| 5,574,630 A | * | 11/1996 | Kresge et al. | 361/792 |
| 5,831,219 A | * | 11/1998 | Kobayashi et al. | 174/261 |
| 6,172,305 B1 | * | 1/2001 | Tanahashi | 174/255 |
| 6,175,088 B1 | * | 1/2001 | Saccocio | 174/262 |
| 6,184,477 B1 | * | 2/2001 | Tanahashi | 174/261 |
| 6,201,194 B1 | * | 3/2001 | Lauffer et al. | 174/264 |
| 6,297,460 B1 | * | 10/2001 | Schaper | 174/261 |

\* cited by examiner

*Primary Examiner*—David L. Talbott
*Assistant Examiner*—I B Patel
(74) *Attorney, Agent, or Firm*—Whitham, Curtis & Christofferson, P.C.

(57) ABSTRACT

A wiring layer on which X-directional signal lines 20 to 22 are arranged is formed on a multilayer board. Rectangular power-source conductive patterns 10c are arranged each in which via holes 12c are formed longitudinally or in the wiring direction of the X-directional signal lines 20 to 22. The area (hatched with broken lines) acts as a wiring channel for the X-directional signal line 22.

14 Claims, 16 Drawing Sheets

FIG. 2A
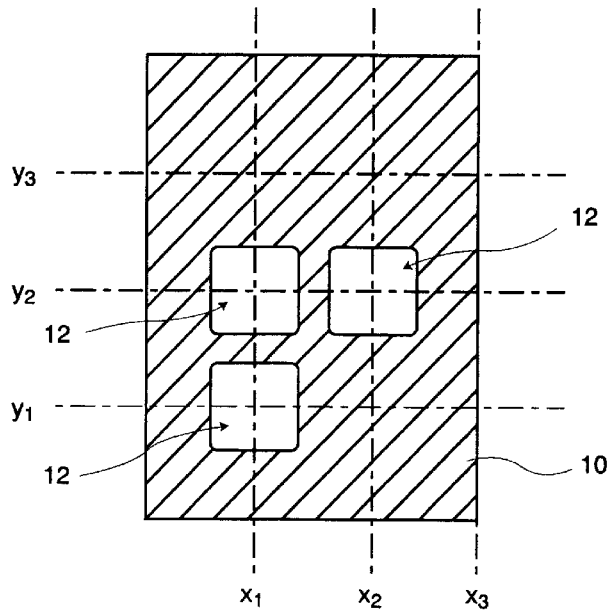
FIG. 2B
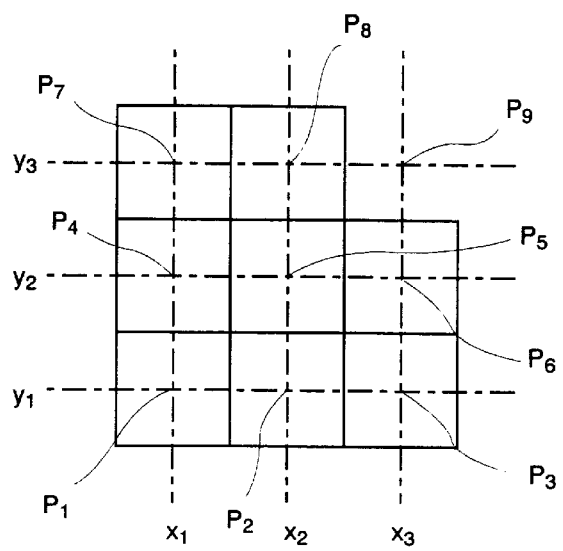
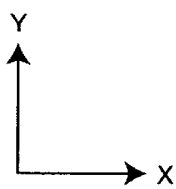

FIG. 3D 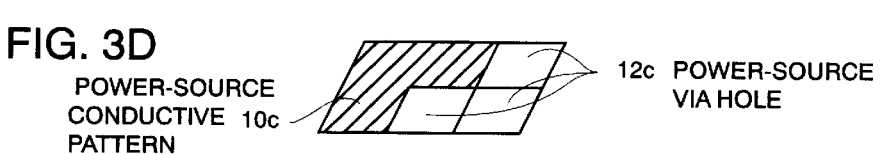 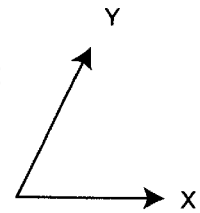

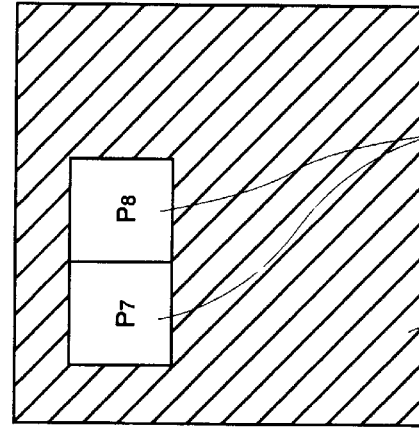
FIG. 4A
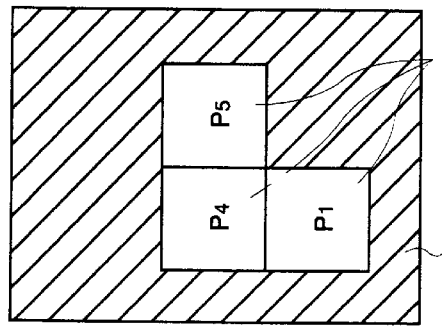
FIG. 4B
FIG. 4C
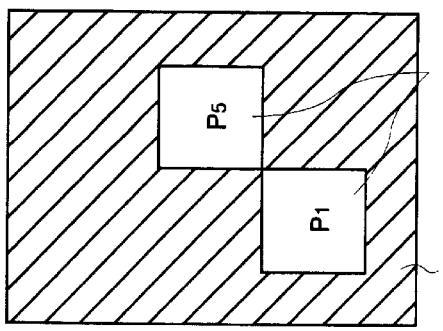
FIG. 4D
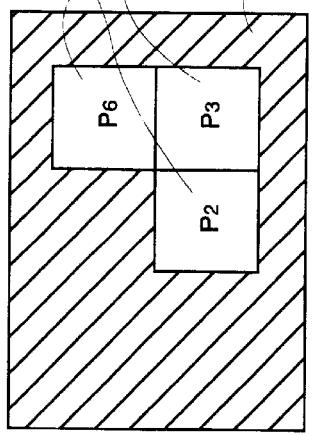

FIG. 12A
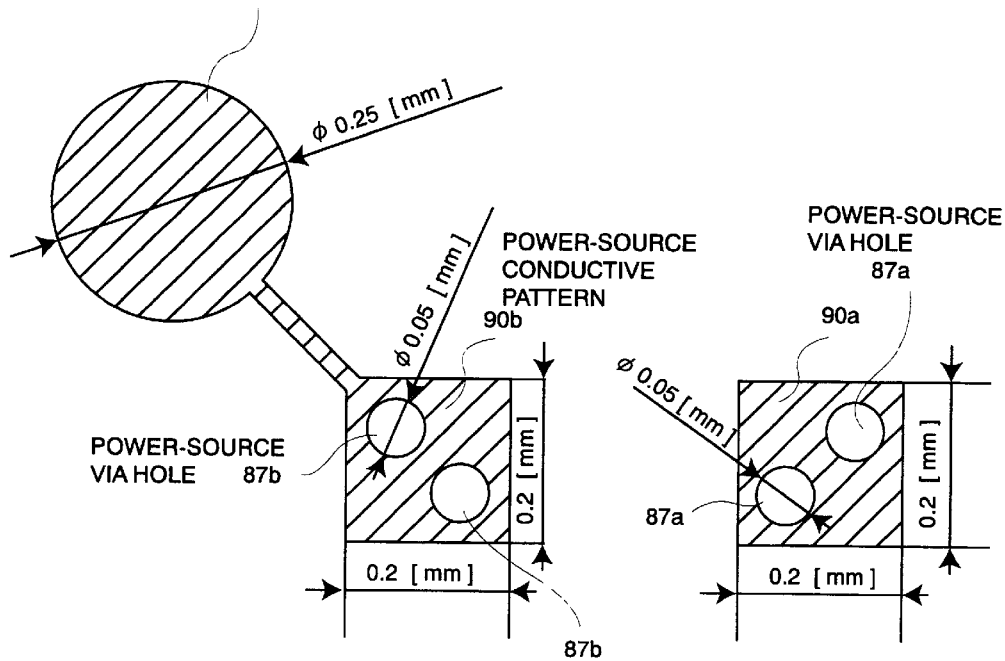
FIG. 12B
FIG. 13
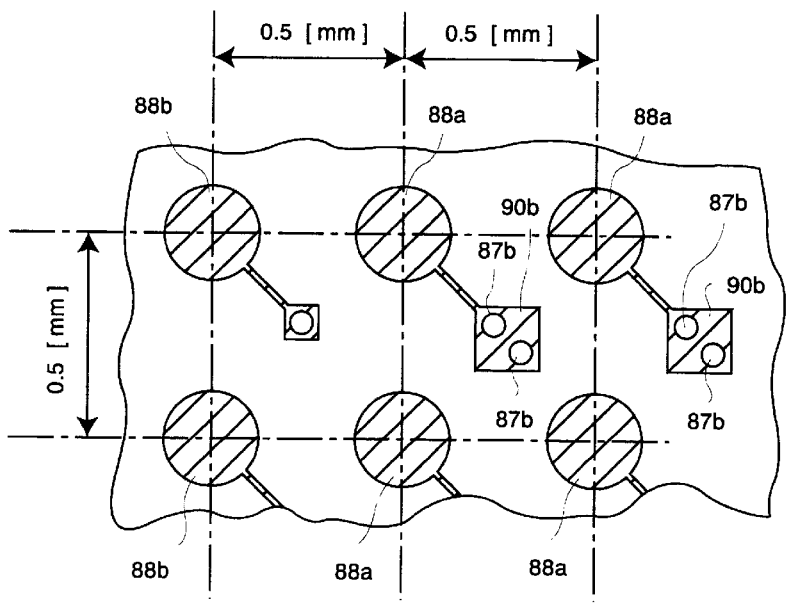

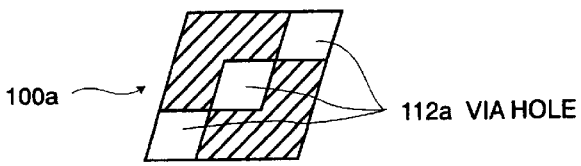
FIG.16A PRIOR ART — 100a, 112a VIA HOLE
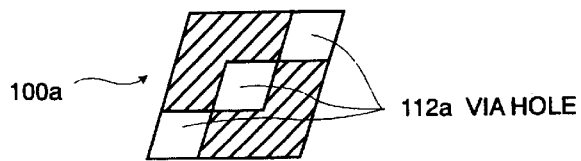
FIG.16B PRIOR ART — 100a, 112a VIA HOLE
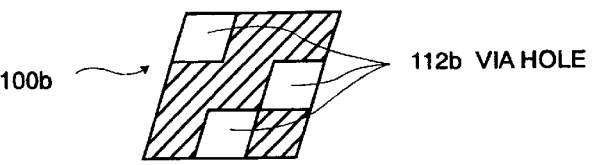
FIG.16C PRIOR ART — 100b, 112b VIA HOLE
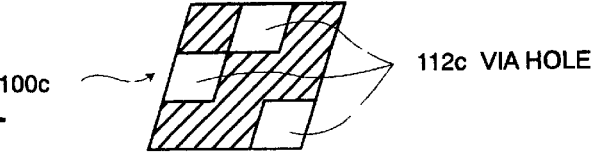
FIG.16D PRIOR ART — 100c, 112c VIA HOLE
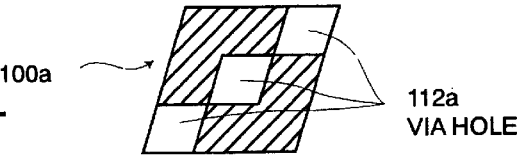
FIG.16E PRIOR ART — 100a, 112a VIA HOLE
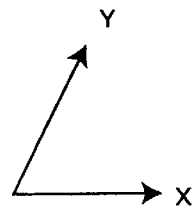
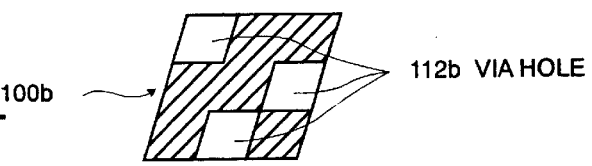
FIG.16F PRIOR ART — 100b, 112b VIA HOLE
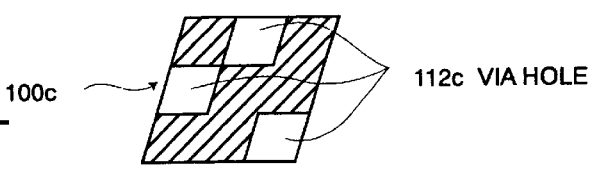
FIG.16G PRIOR ART — 100c, 112c VIA HOLE
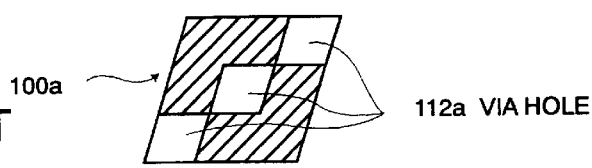
FIG.16H PRIOR ART — 100a, 112a VIA HOLE
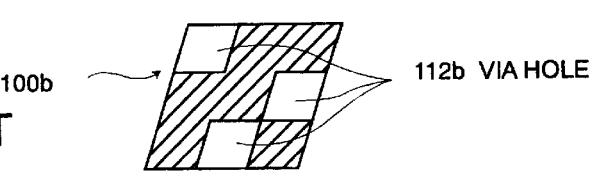
FIG.16I PRIOR ART — 100b, 112b VIA HOLE

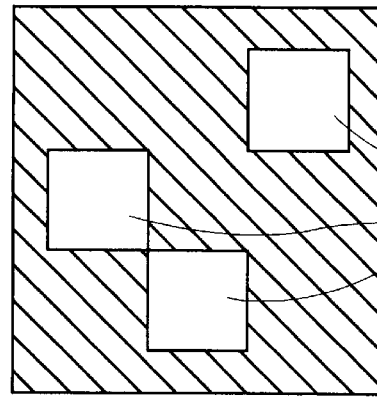
FIG. 17A
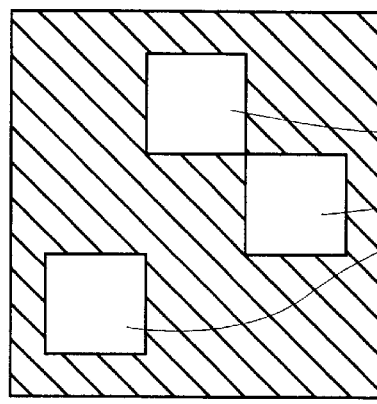
FIG. 17B
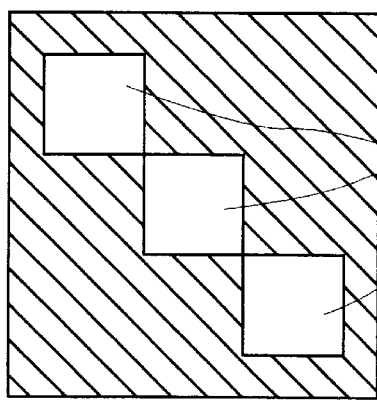
FIG. 17C
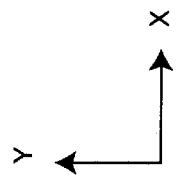
PRIOR ART

MULTILAYER WIRING BOARD

BACKGROUND OF THE INVENTION

The present invention relates to a multilayer wiring board which can carry a large number of LSI chips used for central processing units (CPUs) for large computers, the multilayer wiring board having via holes for supplying the power to the mounted LSIs.

Conventionally, multilayer printed wiring boards have been used for LSI chip mounted wiring boards. The multilayer printed wiring board is fabricated by alternately laminating a copper clad laminate acting as core materials and prepregs acting as an adhesive sheet and then thermally pressing the laminated structure as one piece body. In order to electrically interconnect laminated plates, after core materials and prepregs are integrally laminated, through holes are formed in the laminated structure with a drill. Then, the inner walls of the through holes are plated with copper. Usually, the multilayer printed wiring board is power supplied or grounded via the through holes.

Recently, multilayer wiring boards, in which polyimide resin acting as interlayer insulation is formed on a ceramic substrate, have been used for large computers demanding a high wiring density.

FIG. 14 is a cross-sectional view illustrating a conventional polyimide/ceramic multilayer wiring board.

A ceramic substrate 150 has through holes 151 therein each which electrically connects with an IO terminal 156. Wiring layers are formed on the surface of the ceramic substrate 150. Plural polyimide resin layers 152, each in which a power-source via hole 112 is formed, are build-up on the ceramic substrate 150.

Each polyimide resin layer 152 is made by repeating a series of steps including a polyimide-resin-layer forming step and a wiring layer forming step. The polyimide-resin-layer forming step includes the steps of coating a polyimide precursor on the ceramic substrate 150, drying it, and then forming a power-source via hole 112 in the coated film. The wiring layer forming step includes a photolithographic process, vacuum deposition, and plating.

In such a layer structure, each of the 1aM layer, the 2aM layer, the 4aM layer, the 5aM layer, and the 7aM layer acts as a signal layer. Each of the 0aM layer, the 3aM layer, and the 6aM layer acts as the grounding layer. The 8aM layer acts as a cover surface layer. A power-source conductive pattern 100a with power-source via holes 112 is formed on each of the 8aM layer, the 7aM layer, the 4am layer, and the 1aM. Similarly, a power-source conductive pattern 100b is formed on each of the 6aM layer, the 3aM layer, and the 0aM layer. A power-source conductive pattern 100c is formed on each of the 5aM layer and the 2aM layer.

In order to energize the LSI 155 assembled on the upper surface of the polyimide/ceramic multilayer wiring board with the above-mentioned structure, the power is first guided from the IO terminal 156 formed on the back surface of the ceramic substrate 150 to the 0aM layer through via holes. Moreover, the power is supplied to the soldering bump 154 through the 0aM layer and through the power-source via hole 112 of each layer and through the pad 188 on the 8aM layer being a cover surface layer.

Another mounting pad (not shown) is electrically connected with another soldering bump of the LSI 155 so that the power is electrically connected to the signal layer and the ground layer.

FIG. 15 illustrates a copper-foiled power-source conductor pattern with power-source via holes, arranged on the polyimide/ceramic multilayer wiring board shown in FIG. 14. Power-source via holes 112 are respectively formed at three points of nine points where line segments $X_{1a}$, $X_{2a}$ and $X_{3a}$ dividing in the X direction of the power-source conductor pattern cross with line segments $Y_{1a}$, $Y_{2a}$ and $Y_{3a}$ dividing in the Y-direction thereof. The power-source conductive pattern 100 is of the so-called 3×3 matrix type. Each power-source conductive pattern 112 is formed within the via hole land 113 through a photolithographic process.

The power-source conductive pattern 100 has, for example, a square of 189 ($\mu$m)×189 ($\mu$m). The via hole land 113 has a square of 56 ($\mu$m)×56 ($\mu$m). The power-source via hole 112 has rounded corners R and is of a square of 45 ($\mu$m)×45 ($\mu$m).

FIGS. 16A to 16I illustrate power-source conductive patterns arranged on each of laminated layers in the polyimide/ceramic multilayer wiring board shown in FIG. 14. That is, FIG. 16I shows the bottom layer. FIG. 16A shows the top layer. The power-source conductive patterns 100a, 100b and 100c as well as the via holes 112a, 112b and 112c respectively therein are represented schematically.

FIG. 16A shows the power-source conductive pattern 100a formed on the 8aM layer covering the surface of the top layer. FIG. 16B shows the power-source conductive pattern 100a arranged on the 7aM layer on which a signal line is formed in the Y-direction. FIG. 16E shows the power-source conductive pattern 100a arranged on the 4aM layer on which a signal line is formed in the Y-direction. FIG. 16H shows the power-source conductive pattern 100a arranged on the 1aM layer on which a signal line is formed in the Y-direction. FIG. 16C shows the power-source conductive pattern 100b arranged on the 6aM layer or the ground layer connected to the ground. FIG. 16F shows the power-source conductive pattern 100b arranged on the 3aM layer or the ground layer connected to the ground. FIG. 16I shows the power-source conductive pattern 100b arranged on the 0aM layer or the ground layer connected to the ground.

Moreover, FIG. 16D shows the power-source conductive pattern 100c arranged on the 5aM layer on which a signal line is formed in the X-direction. FIG. 16G shows the power-source conductive pattern 100c arranged on the 2aM layer on which a signal line is formed in the X-direction.

Each of FIGS. 17A and 17C is a plan view schematically illustrating a conductive pattern formed on each layer.

FIG. 17A shows the power-source pattern 100a arranged on the layer on which a signal line is formed in the Y-direction. FIG. 17B shows the power-source pattern 100b arranged on the layer connected to the ground. FIG. 17C shows the power-source pattern 100c arranged on the layer on which the signal line formed in the Y-direction. Three power-source via holes 112a are arranged in the power-source conductive pattern 100a, as shown in FIG. 17A. Three power-source via holes 112b are arranged in the power-source conductive pattern 100b, as shown in FIG. 17B. Three power-source via holes 112c are arranged in the power-source conductive pattern 100c, as shown in FIG. 17C. That is, the power-source via holes 112a to 112c are positioned in such a way that the projected positions of the power-source via holes 112a to 112c are not aligned with each other when the power-source conductive patterns 100a to 100c are piled up.

The power-source conductive patterns 100a to 100c are piled up in the order shown in FIGS. 16A to 16I. The power-source via holes 112a to 112c respectively formed in the power-source conductive patterns 100a to 100c are of the same type of conductive pattern. For example, the power-source via hole 112a in the power-source conductive pattern 100a disposed on a layer having signal lines formed in the Y-direction is electrically connected to only the power-source via hole 112a in the power-source conductive pattern 100a disposed on another layer. In other type of conductive pattern, that is, both the power-source via hole 112b formed on the power-source conductive pattern 100b and the power-source via hole 112c formed on the power-source conductive pattern 100c are not electrically connected to the power-source via hole 112a in the power-source conductive pattern 100a because the power-source via hole 112a is arranged as shown in the above example.

FIG. 18 illustrates the relationship between conductive patterns formed on the 5aM layer and X-directional signal lines.

Of areas where five wiring channels can be arranged on the 5aM layer with the power-source conductive patterns 100c, only the areas where two outer signal lines, that is, the X-directional signal lines 120 and 121 act as wiring channels. Three inner signal lines act as non wiring channels because of the presence of the power-source conductive pattern 100c.

The power-source via holes 112a to 112c are positioned in such a way that the projection positions thereof are not aligned with each other in the adjacent layer and the next adjacent layer. For example, the power-source via hole 112c on the 2aM layer is formed at a different position with respect to the power-source via hole 112a on the 1M layer (an adjacent layer), the power-source via hole 112b on the 3M layer (an adjacent layer), the power-source via hole 112a on the 0aM layer (the next adjacent layer), and the power-source via hole 112a on the 4M layer (the next adjacent layer). The reason is to solve the question that degradation of the stiffness of the portion where upper and lower via holes are aligned with each other may cause a warp of the polyimide resin layer 152, so that the reliability of via hole connection cannot be ensured.

Next, a conventional build-up board will be explained below as one example of multilayer wiring boards.

The build-up board belongs to one of multilayer wiring boards. An insulating layer of a photo-sensitive resin is formed on a multilayer printed wiring substrate using a glass epoxy resin insulator. Minute via holes are opened in the printed substrate using a photolithographic process or laser. Connection between the upper layer and the lower layer and pattern formation are performed through a plating step. Thus, the build-up board is made by sequentially piling up build-up layers. This allows LSI terminals to be arranged in high density.

FIG. 19 is a plan view schematically and partially illustrating a conventional build-up board.

The mounting pad 188b, on which a soldering bump of a LSI (not shown) is placed, is electrically connected to a signal transmission via hole 189 for signal transmission formed within a via hole land 190. The mounting pad 188a is electrically connected to a signal transmission via hole 187b formed within a via hole land 190.

The via hole land 190 has a dimension of 0.075 (mm)× 0.075 (mm). The signal via hole 189 has a diameter of 0.05 mm. The power-source via hole 187b has a diameter of 0.05 mm. The build-up board has a ground via hole (not shown) of a diameter of 0.05 mm and a via hole land (not shown) of a diameter of 0.05 mm.

However, in order to deal with an increased number of signals connected between LSIs with the recent trend toward high density, it is required to increase the number of wiring channels per layer within a limited number of wiring layers. The number of via holes for power supplying or grounding has to be reduced as small as possible. Meanwhile, the voltage necessary for operation of an LSI has to be maintained, with an electric resistance suppressed between the power supply pin on the back surface of the base substrate and the LSI. This leads to increasing the diameter of a via hole or to increasing the number of via holes for power supplying and for grounding as degree as possible. There is a contradiction between that approach and a demand for increasing the number of wiring channels.

In the conventional structure, a plurality of via holes are uniformly arranged in a matrix form of 3×3 to one power supply pin of an LSI, independently of the layer structure. In the 3×3 type arrangement, as shown schematically in FIG. 18, the case often occurs where, of areas where five wiring channels are disposed, only two outer lines are wiring channels while the inner three power-source lines are wiring channels because of the presence of the power-source conductor pattern 100c. In the case of the 3×3 conductive pattern, since an increasing number of LSI pins leads to increasing not only signal lines but also power supply terminals, the number of signals to be wired increases. However, in that case, it becomes difficult to increase the number of wiring channels because of the presence of a conductive pattern in which via holes are formed. The number of wiring channels may be increased by densely making the wiring grid or increasing the number of wiring layers. However, this approach results in increased costs due to degradation in product quality.

In order to fully power-supply or ground LSIs on the build-up board, a single power-source via hole or grounding via hole having the same diameter as that the signal via hole formed one via hole land has a high resistance, so that an necessary voltage cannot be often supplied. In order to decrease the resistance, it is necessary to increase the size of a via hole. However, formation of a through hole in the build-up layer makes it difficult to deal with a high dense assembly being the feature of the build-up board.

SUMMARY OF THE INVENTION

The objective of the invention is to provide a multilayer wiring board that can increase wiring channels in a wiring layer and can secure power-source via holes needed for power supplying.

A second object of the invention is to provide a multilayer wiring board that has via holes for power-supplying and grounding, each having a decreased electric resistance.

In achieve the above mentioned objectives, a multilayer wiring board according to the present invention comprises a first wiring layer having a first wiring pattern; a second wiring layer having a second wiring pattern; the wiring direction of the first wiring pattern and the wiring direction of the second wiring pattern being substantially perpendicularly to each other, the first wiring layer and second wiring layer being laminated; and a plurality of conductive patterns formed on each of the first and second wiring layers in such a way that each of long sides is oriented substantially in the same direction as the wiring direction of a wiring pattern formed on each wiring layer, each of the conductive patterns in which a plurality of via holes are formed, each of the conductive patterns having a nearly rectangular form.

In the multilayer wiring board with the above-mentioned structure according to the present invention, the long side of a rectangular conductive pattern on which via holes are formed is oriented substantially in the same direction as that of the wiring pattern. The area occupied by a wiring pattern in the arranged direction on a conductive pattern on which the long side is oriented substantially the same direction as the direction of the wiring pattern is small, compared with the occupied area of a conventional rectangular conductive pattern.

The position at which each via hole in each of the conductive patterns formed on the first wiring layer is projected may not aligned with a position at which each via hole in each of the conductive patterns formed on the second wiring layer. This structure can avoid electrically interconnecting wiring layers on which wiring patterns are formed in different directions.

Moreover, the long side of each of the conductive patterns may correspond to the length along which at least three via holes can be formed. The short side of each of the conductive patterns may correspond to the length along which at least two via holes can be formed. In this case, at least two via holes may be formed in each of the conductive patterns.

Moreover, according to the present invention, the multilayer wiring board comprises a first wiring layer and a second wiring layer laminated to each other; a plurality of first conductive patterns arranged on the first wiring layer, each of the plurality of first conductive patterns having a plurality of power-source via holes; and a plurality of second conductive patterns arranged on the second wiring layer, each of the plurality of second conductive patterns having a plurality of power-source via holes at positions which are not aligned with positions where the via holes in the first pattern are projected.

In the multilayer wiring board with the above-mentioned structure according to the present invention, plural power-source via holes are formed in the conductive pattern, so that the electric resistance upon power supplying can be reduced.

Furthermore, according to the present invention, the multilayer wiring board comprises a first wiring layer and a second wiring layer laminated to each other; a plurality of first conductive patterns arranged on the first wiring layer, each of the plurality of first conductive patterns having a plurality of grounding via holes; and a plurality of second conductive patterns arranged on the second wiring layer, each of the plurality of second conductive patterns having a plurality of grounding via holes at positions which are not aligned with positions where the via holes in the first pattern are projected.

In the multilayer wiring board with the above-mentioned structure according to the present invention, plural grounding via holes are formed in the conductive pattern, so that the electric resistance upon power supplying can be reduced.

BRIEF DESCRIPTION OF THE DRAWINGS

This and other objects, features and advantages of the present invention will become more apparent upon a reading of the following detailed description and drawings, in which:

FIG. 2A and FIG. 2B are plan views illustrating a power-source conductive pattern according to the first embodiment of the present invention, indicating the positions of via holes;

FIG. 3A to FIG. 3I are schematic diagrams illustrating power-source conductive patterns respectively arranged on layers of the polyimide/ceramic multilayer wiring board in FIG. 1A and 1B;

FIG. 4A to FIG. 4D are plan views of schematically illustrating the positions of via holes formed in a power-source conductive pattern arranged on each layer;

FIG. 12A and FIG. 12B are diagrams explaining dimensions of a mounting pad and dimensions of a power-source conductive pattern, the mounting pad and the power-source conductive pattern being formed on a build-up layer according to the second embodiment of the present invention;

FIG. 13 is a diagram illustrating the spacing between mounting pads arranged on a build-up layer according to the second embodiment of the present invention;

FIG. 16A to FIG. 16I are schematic diagrams illustrating a power-source conductive pattern arranged on each layer of the polyimide/ceramic cmultilayer wiring board shown in FIG. 14.

FIG. 17A to FIG. 17c are cross-sectionals explaining the positions of via holes formed on the conventional conductive pattern.

DESCRIPTION OF THE EMBODIMENTS

Embodiments of the present invention will be described below with reference to the attached drawings.

(First Embodiment)

Figure 1A:
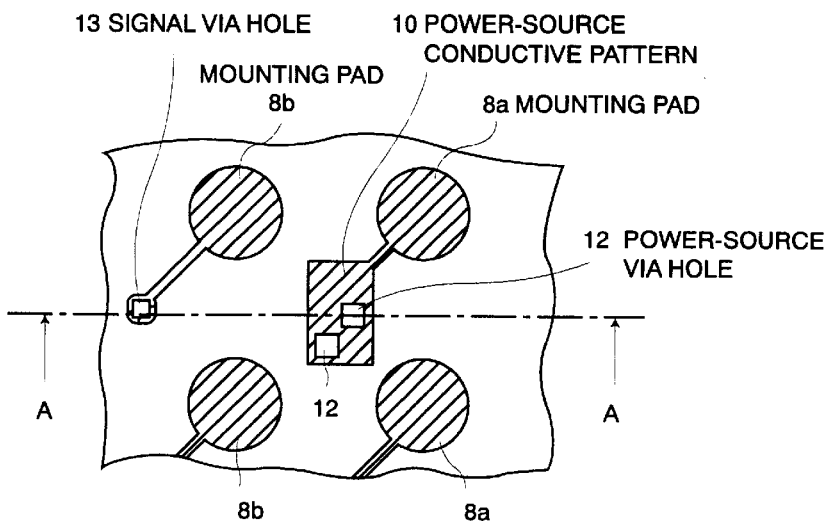
FIG. 1A and FIG. 1B are cross-sectional views schematically illustrating a polyimide/ceramic multilayer wiring board according to a first embodiment of the present invention.
Figure 1B:
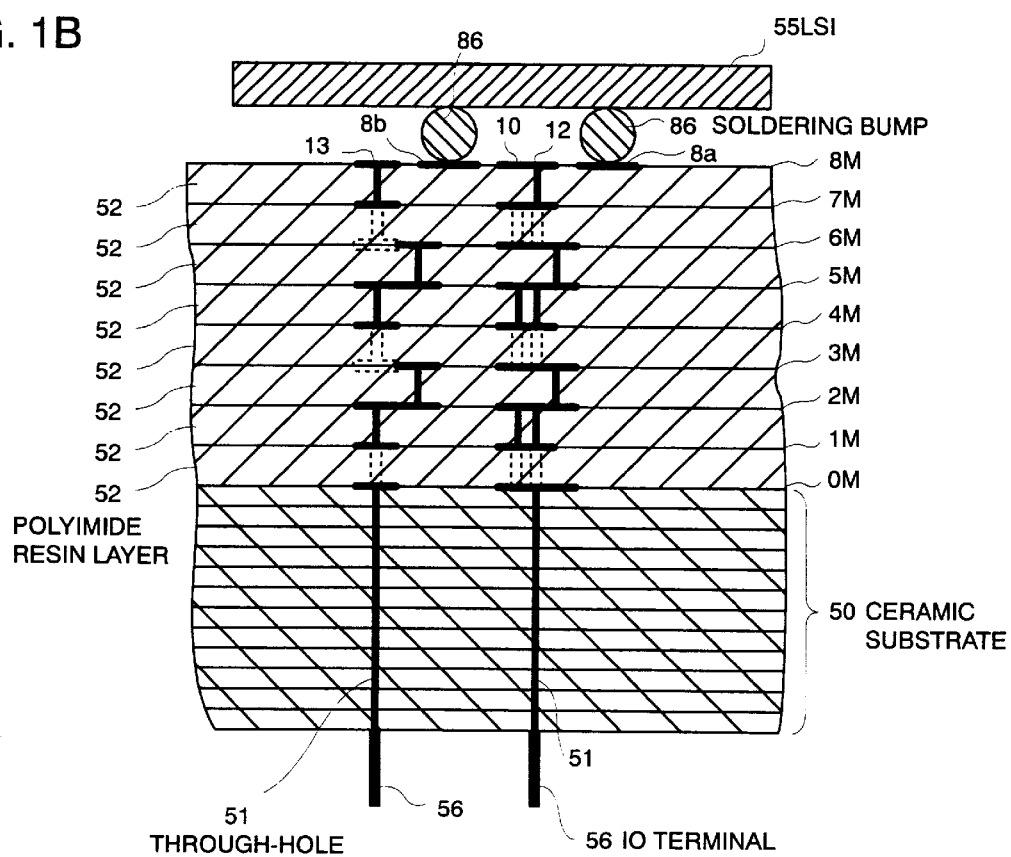

FIG. 1A is a plan view illustrating a polyimide/ceramic multilayer wiring board according to a first embodiment of the present invention. FIG. 1B is a cross-sectional view schematically illustrating the polyimide/ceramic multilayer wiring board taken along the line A—A of FIG. 1A.

Referring to FIG. 1A, mounting pads 8a and 8b, a rectangular power-source conductive pattern 10, and a signal via hole 13 are formed on the surface of the polyimide/ceramic multilayer wiring board. A soldering bumps 86 of a LSI 55 (to be described later) are respectively placed on the mounting pads 8a and 8b. The rectangular power-source conductive pattern 10 is electrically connected to a mounting pad 8a and has two power-source via holes 12. The signal via hole 13 is electrically connected to a mounting pad 8b.

Next, the laminated structure of the polyimide/ceramic multilayer wiring board of the present embodiment will be explained by referring to FIG. 1B.

A plurality of polyimide resin layers 52 are piled up on the ceramic substrate 50 through which through holes 51 are formed to communicate with IO terminals 56. Each polyimide resin layer 52 has a wiring layer 0M, . . . , or 8M formed on the surface thereof and a power-source via hole 12 to electrically connect to other wiring layer.

The method of forming polyimide resin layers 52 includes the steps of coating a polyimide precursor varnish on the ceramic substrate 50 (or on the wiring layer of the second layer or more), drying it, forming on the coated film a polyimide resin layer in which via holes are to be formed, forming wiring layers through a photolithographic process, vacuum deposition, and plating process. A laminated structure of polyimide resin layers 52, each on which wiring layers is formed, are fabricated by repeating a series of the above steps.

Each of the wiring layers 1M, 2M, 4M, 5M, and 7M acts as a signal layer. Each of the wiring layers 0M, 3M, and 6M acts as a ground layer. The wiring layer 8M acts as a covered surface layer.

Signal layers on which signal lines are arranged in the Y-direction (in the inner direction in FIG. 1B) correspond to 1M, 4M and 7M. Signal layers on which signal lines are arranged in the X-direction (in the horizontal direction in FIG. 1B) correspond to 2M and 5M.

In order to energize the LSI 55 assembled on the upper surface of the polyimide/ceramic multilayer wiring board with the above structure, the power is first applied from IO terminal 56 disposed on the back surface of the ceramic substrate 50 to the 0M layer via a through hole. Moreover, the power is supplied from the 0M layer to the LSI 55 through the power-source via holes 12 of each layer, the mounting pad 8a formed on the cover surface layer or 8M layer, and the soldering bump 54.

The soldering bump 86 of the LSI 55 is electrically connected to the mounting pad 8b, thus being connected to the signal layer.

FIG. 2A is a plan view illustrating a copper-foiled power-source conductive pattern which is disposed on the 1M or 4M layer of the polyimide/ceramic multilayer wiring board shown in FIG. 1B and which has power-source via holes formed therein. Each power-source via hole 12 is formed at each of three points of six points where line segments $X_1$ and $X_2$ dividing in the X direction of the rectangular power-source conductor pattern 10a cross with line segments $Y_1$, $Y_2$ and $Y_3$ dividing in the Y-direction thereof. The power-source via hole 12 is formed using the photolithographic process.

FIG. 2B is a schematic diagram explaining the positions of power-source via holes 12a, 12a', 12b, and 12c (to be described later). Referring to FIGS. 3 to 6, the positions of the power-source via holes 12a, 12a', 12b, and 12c are schematically shown.

The line segments $X_1$, $X_2$ and $X_3$ and the line segments $Y_1$, $Y_2$ and $Y_3$ shown in FIG. 2B correspond to those in FIG. 2A, respectively. $P_1$ to $P_9$ respectively represent cross points between the line segments. Areas surrounded by solid lines in FIG. 2B represent power-source via holes 12a, 12a', 12b, and 12c. For example, three power-source via holes 12 in FIG. 2A are formed at the positions $p_1$, $P_4$ and $p_5$ shown in FIG. 2B, respectively. Explanation will be made referring to the positions $P_1$ to $P_9$ of via holes. In the embodiment, a via hole is not formed at the position $P_9$. However, the present invention should not be limited to only this embodiment. If necessary, a via hole may be formed at the position $P_9$.

Figure 3A:
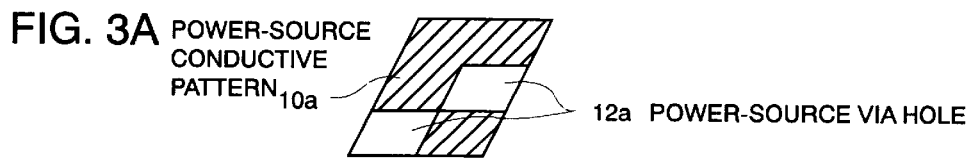
Figure 3B:
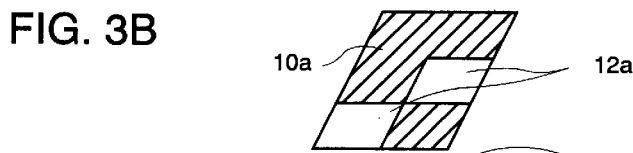
Figure 3C:
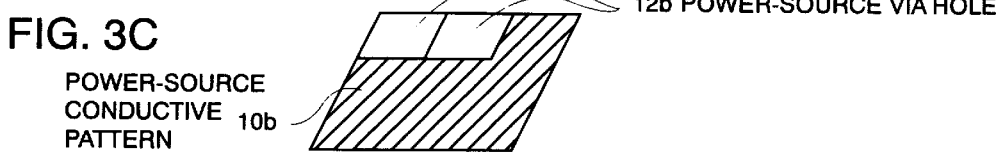
Figure 3E:
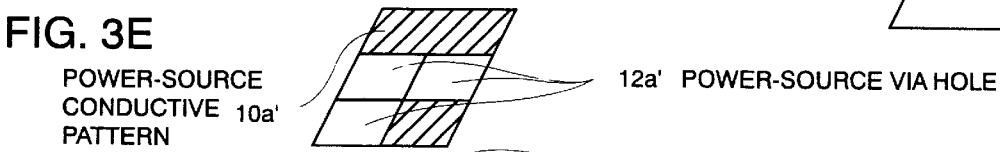
Figure 3F:
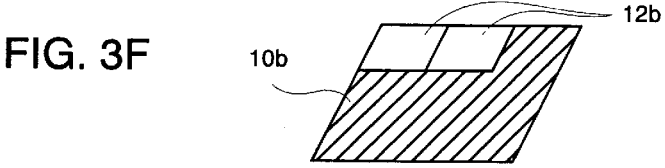
Figure 3G:
Figure 3H:
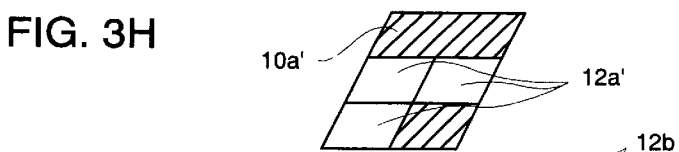
Figure 3I:
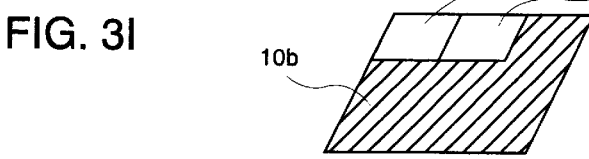

Next, referring to FIGS. 3A to 3I, power-source conductive patterns to be respectively formed on the wiring layers 0M to 8M in the polyimide/ceramic multilayer wiring board shown in FIG. 1 are shown in the order of laminated layers. That is, FIG. 3I shows the lowest layer, or the 0M layer. FIG. 3A shows the top layer, or, the 8M layer.

FIG. 3A shows the power-source conductive pattern 10a formed on the 8M layer and covering the top surface. FIG. 3B shows the power-source conductive pattern 10a on the 7M layer on which signal lines are arranged in the Y-direction.

FIG. 3E shows the 4M layer on which signal lines are arranged in the Y-direction, as shown with the 7M layer. FIG. 3H shows the power-source conductive pattern 10a' on the 1M layer.

FIG. 3C shows the power-source conductive pattern 10b formed on the 6M layer being the ground layer. FIG. 3F shows the power-source conductive pattern 10b formed on the 3M layer being the ground layer. FIG. 3I shows the power-source conductive pattern 10b formed on the 0M layer being the ground layer.

Moreover, FIG. 3D shows the power-source conductive pattern 10c on the 5M layer on which signal lines are arranged in the X-direction. FIG. 3G shows the power-source conductive pattern 10c on the 2M layer on which signal lines are arranged in the X-direction.

Next, FIGS. 4A to 4D are plan views each schematically illustrating a power-source conductive pattern on each layer.

FIG. 4A shows the conductive pattern 10a formed on the 8M layer and the 7M layer. FIG. 4B shows the conductive pattern 10a' formed on the 4M layer and the 1M layer. FIG. 4C shows the conductive pattern 10c formed on the 6M layer, the 3M layer and the 0M layer. FIG. 4D shows the power-source conductive pattern 10d formed on the 5M layer and the 2M layer.

In the power-source conductive pattern 10a in FIG. 4A, the power-source via holes 12a are respectively formed at the positions $P_1$ and $P_5$. In the power-source conductive pattern 10a' in FIG. 4B, the power-source via holes 12a' are respectively formed at the positions $P_1$, $P_4$, and $P_5$. In the power-source conductive pattern 10b in FIG. 4C, the power-source via holes 12b are respectively formed at the positions $P_7$ and $P_8$. In the power-source conductive pattern 10c in FIG. 4D, the power-source via holes 12c' are respectively formed at the positions $P_2$, $P_3$ and $P_6$.

Figure 5:
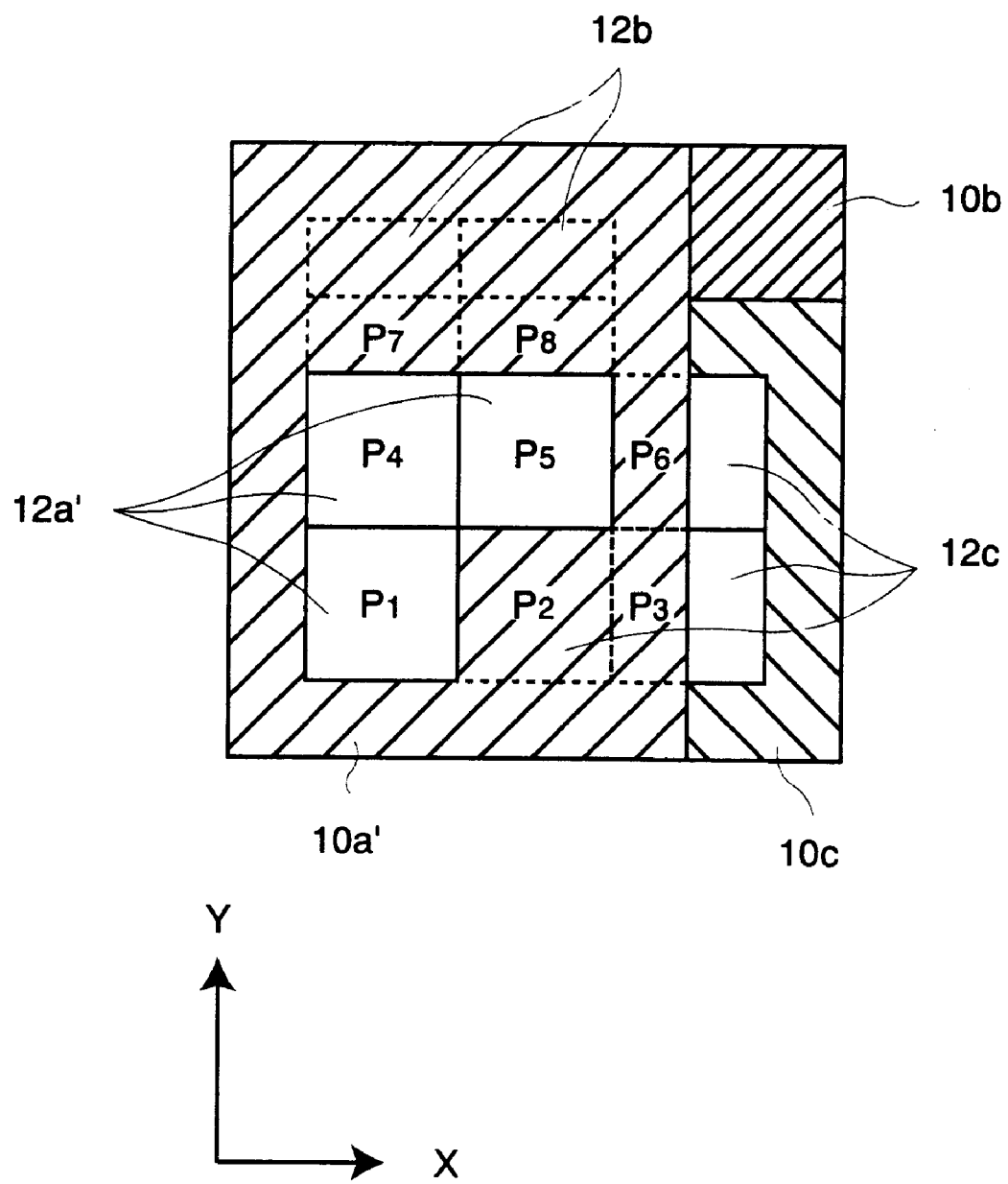
FIG. 5 is a transparent plan view schematically illustrating a power-source conductive pattern arranged on each layer.

FIG. 5 is a transparent plan view schematically illustrating relationships between projected positions of a power-source via hole formed in the power-source conductive pattern on a layer on which signal lines are arranged in the Y-direction and a power-source via hole formed in the power-source conductive pattern on a layer on which signal lines are arranged in the X-direction and a power-source via hole formed in the power-source conductive pattern of the ground layer, in a laminated state.

As shown in FIG. 5, among the power-source via hole 12a' formed at the positions $P_1$, $P_4$ and $P_5$ of a power-source conductive pattern 10a', the power-source via hole 12c formed at the positions $P_2$, $P_3$ and $P_6$ of a power-source conductive pattern 10c and the power-source via hole 12b formed at the positions $P_7$ and $P_8$ of a power-source conductive pattern 10b, the projected positions thereof are not overlapped.

In other words, the power-source conductive patterns 10a', 10b and 10c are piled up in the order shown in FIGS. 3A to 3I. Of the power-source via hole 12a' formed in the power-source conductive pattern 10a', the power-source via hole 12b formed in the power-source conductive pattern 10b, and the power-source via hole 12c formed in the power-source conductive pattern 10c, the same patterns are electrically connected together. For example, the power-source via holes 12a', which are formed at the positions $P_1$, $P_4$ and $P_5$ of the power-source conductive pattern 10a' on the 1M layer on which signal lines are arranged in the Y-direction, are connected respectively and electrically with the power-source via holes 10a', which are formed at the positions $P_1$, $P_4$ and $P_5$ of the power-source conductive pattern 10a' on the 5M layer on which signal lines are arranged in the Y-direction. The power-source via holes 12a, which are formed at the positions $P_1$ and $P_5$ of the power-source conductive pattern 10a on the 7M layer on which signal lines are arranged in the Y-direction, are connected respectively and electrically with the power-source via holes 12a', which are formed at the positions $P_1$ and $P_5$ of the power-source conductive pattern 10a' on each of the 1M and 5M layers. In other type of pattern, the power-source via holes 12b formed in the power-source conductive pattern 10b and the power-source via holes 12c formed in the power-source conductive pattern 10c are formed at positions other than the positions $P_1$, $P_4$ and $P_5$. Hence, the power-source via hole 12a' in the power-source conductive pattern 10a' is not electrically connected with the power-source via hole 12a in the power-source conductive pattern 10a.

Except for the relationship between the 8M layer being a cover surface layer and the 7M layer being the layer underneath the 8M layer, respective layers are piled up in such a way that the power-source via holes 12a', 12b and 12c are not projected on an adjacent layer and the next adjacent layer. For example, as shown in FIG. 3, the power-source via holes 12c in the 2M layer (FIG. 3G) is disposed at a position different from the positions of the power-source via holes 12a' in the 1M layer (adjacent layer) (FIG. 3H), the power-source via holes 12b in the 3M layer (FIG. 3F), the power-source via holes 10b in the 0M layer (the next adjacent layer) (FIG. 3I), and the power-source via holes 10a' in the 4M layer (FIG. 3E). That is, the same patterns (including the power-source conductive pattern 10c on the 2M layer and the power-source conductive pattern 10c on the 5M layer) are piled up while two different patterns (including the power-source conductive pattern 10b on the 3M layer and the power-source conductive pattern 10a' on the 4M layer) are piled up. When the via hole in the upper layer and is aligned with the via hole in the lower layer, the rigidity of the polyimide resin layer 152 is degraded at the overlapped portion. This may cause a warp, or deformation, of the polyimide resin layer 152. The above structure can prevent the reliability in connection between via holes from being degraded.

Figure 6:
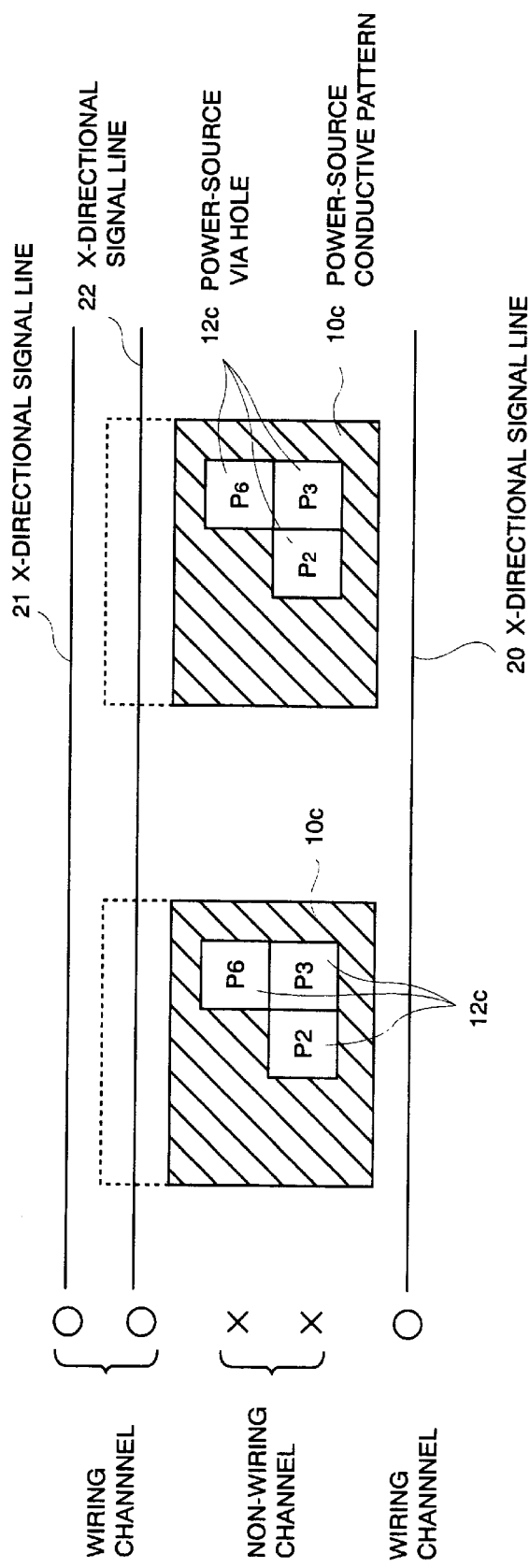
FIG. 6 is a schematic diagram explaining a relationship between a power-source conductive pattern and a signal line in the X-direction, which are formed on the 5M layer.

FIG. 6 is a diagram schematically illustrating a relationship between power-source conductive patterns and signal lines arranged in the X-direction on the 5M layer.

Figure 18:
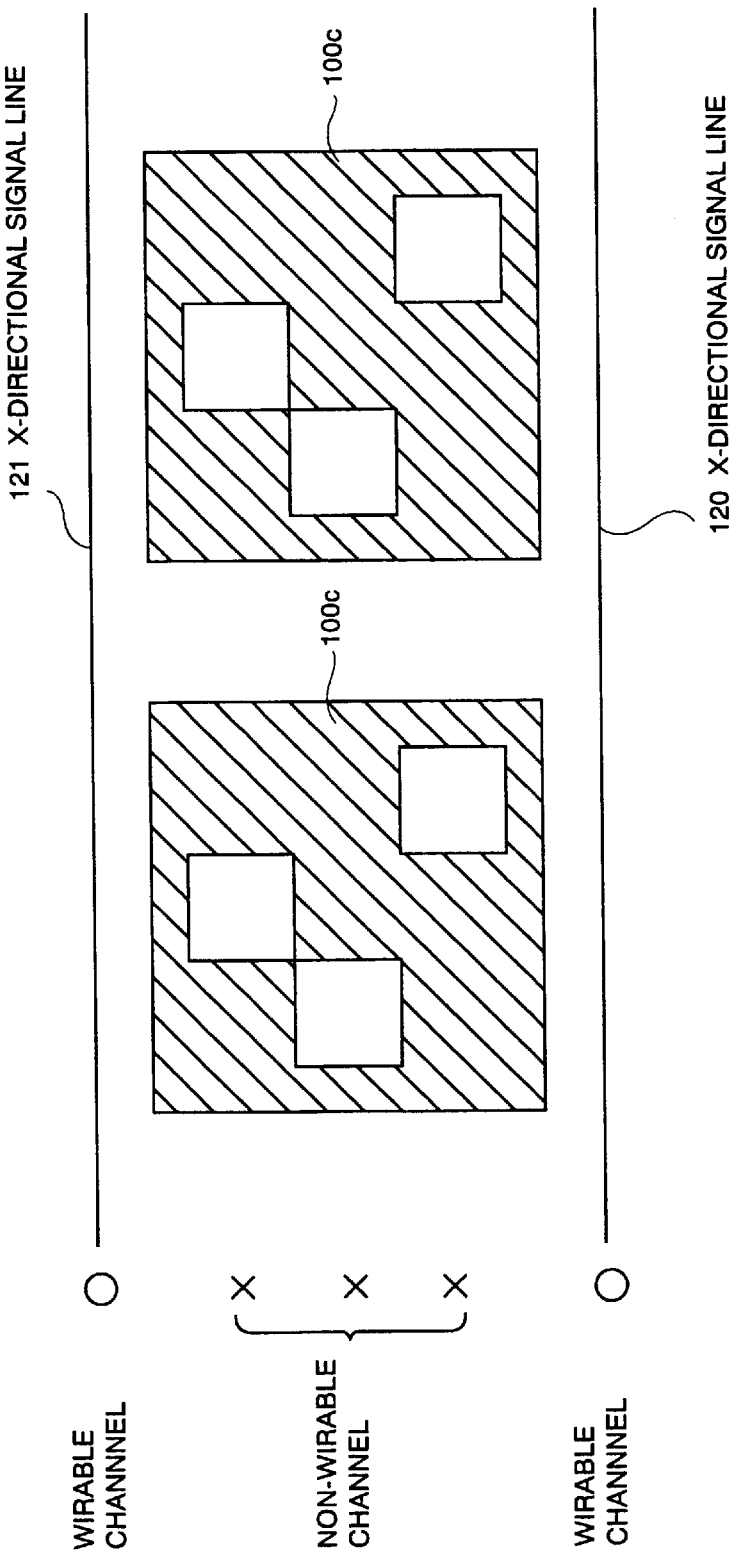
FIG. 18 is a schematic diagram explaining a relationship between a power-source conductive pattern and a X-directional signal line formed on the layer 5aM and FIG. 19 is a plan view schematically illustrating a conventional power-source conductive pattern.

Since the conventional power-source conductive pattern 100c shown in FIG. 18 has a 3×3 matrix form, it exists even in the area (shown with broken lines).

According to the present embodiment, since the long side of the power-source conductive pattern 10c is arranged in the same direction of as that of signal lines, the power-source conductive pattern 10c exists in only the area (shown with solid lines). The area shown with broken lines becomes an extra area. This makes it possible to arrange not only the signal lines 20 and 21 in the X-direction of five wiring channels but also the signal line 22 in the X-direction. That is, the number of wiring channels can be increased from two to three. Similarly, the number of wiring channels in the X-directional signal line on the 2M layer can be increased by one. As to the 7M layer, the 4M layer and the 1M layer, the number of wiring channels in the Y-directional signal line can be increased by one, compared with the conventional power-source conductive pattern 100a.

As described above, the present embodiment can increase the number of wiring channels since a power-source conductive pattern is arranged between wiring patterns so as to the long side of the power-source conductive pattern is oriented in the same direction as that of the wiring patterns.

(Second Embodiment)

Figure 7:
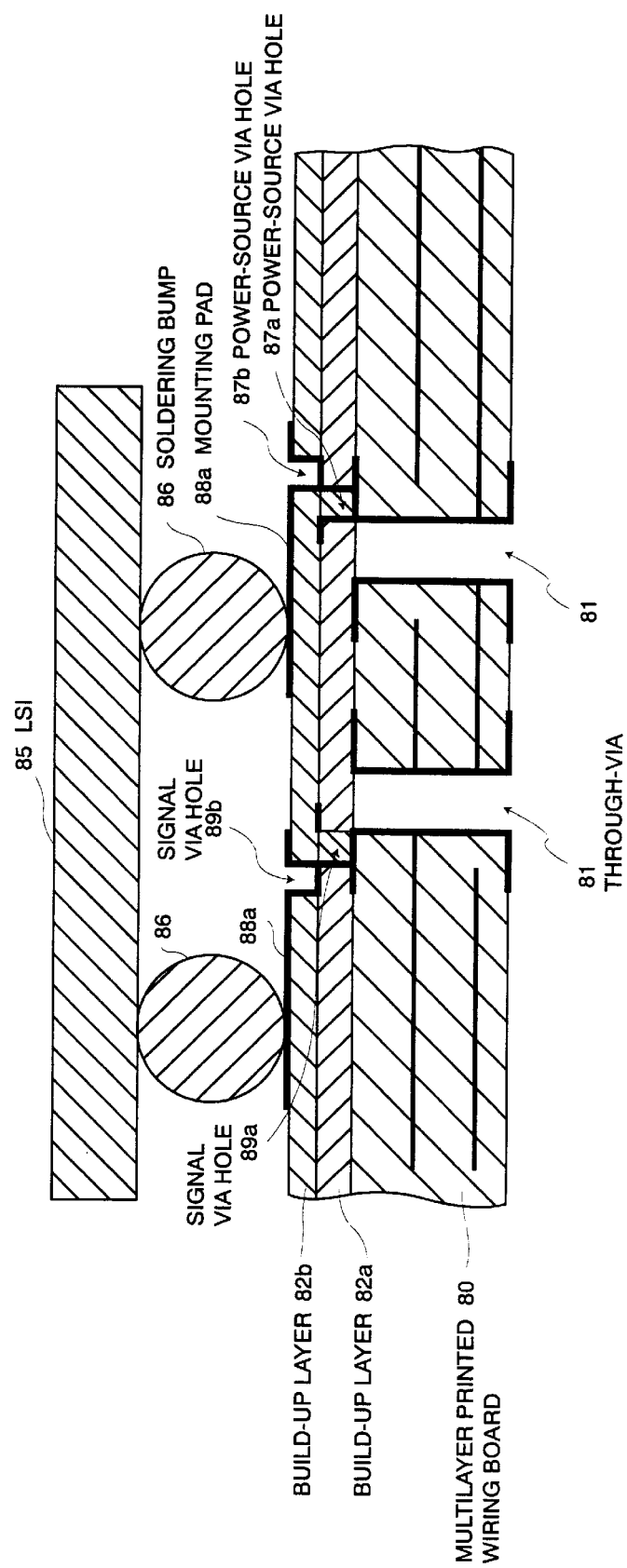
FIG. 7 is a cross-sectional view schematically illustrating a build-up board according to a second embodiment of the invention.
Figure 8:
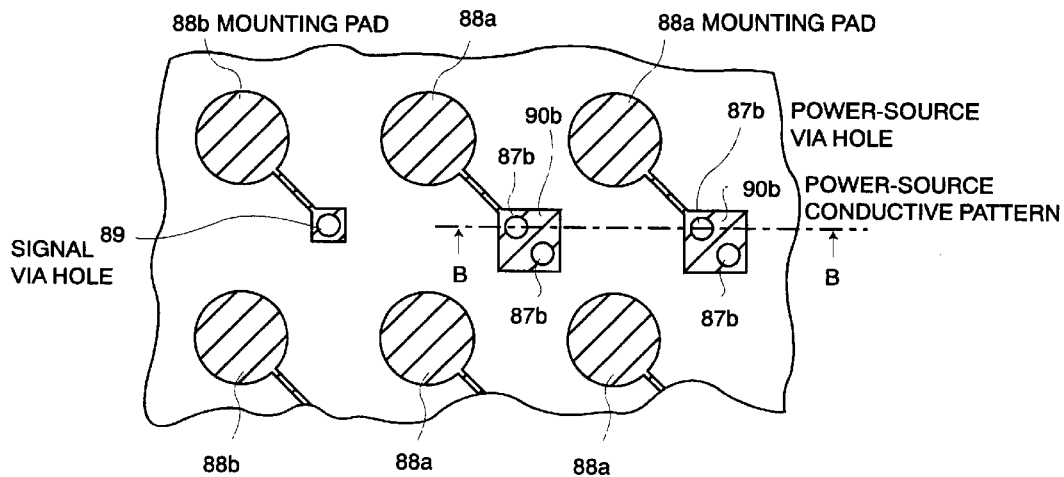
FIG. 8 is a plan view schematically illustrating the build-up board shown in FIG. 7.

FIG. 7 is a cross-sectional view partially illustrating a build-up board on which a LSI is mounted on the surface thereof, according to the second embodiment of the present invention. FIG. 8 is a plan view schematically and partially illustrating the build-up board shown in FIG. 7. FIG. 7 is a side cross-sectional view illustrating the build-up board taken along the line B—B in FIG. 8.

Build-up layers 82a and 82b are build-up over a multi-layer printed wiring board 80. The multilayer printed wiring board 80, using a glass epoxy resin acting as an insulator, has through via 81 therein. The build-up layer 82a has a power-source via hole 87a while the build-up layer 82b has a power-source via hole 87b. Mounting pads 88a, each on which a soldering bump 86 of the LSI 85 is placed, are formed on the surface of the build-up layer 82b. A power-source via hole 87a and a signal via hole 89a, each having a minute diameter, are opened in the build-up layer 82a using the photolithographic process or laser beam. Thereafter, electrical connections with the top surface of the multilayer printed wiring board 80 as well as patterning are performed through plating while the build-up layer 82a is build-up on the multilayer printed wiring board 80. Next, a power-source via hole 87b is opened in the build-up layer 82b. Thereafter, electrical connections with the build-up layer 82a as well as patterning are performed through plating while the build-up layer 82b is build-up on the build-up layer 82a.

Thus, the soldering bumps 86 of the LSI 85 are respectively placed on the mounting pads 86a of the build-up layer 82b of the resultant build-up board so that the LSI 85 is electrically connected with the build-up board.

Round mounting pads 86a and 86b are arranged at equal intervals, as shown in FIG. 8. The mounting pad 86a is electrically connected to two power-source via holes 87b for power supplying, which are formed on the square power-source conductive pattern 90b. The mounting pad 88b is electrically connected to the signal via hole 89 for signal transmission.

Figure 9A:
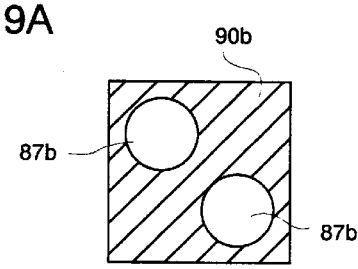
FIG. 9A and FIG. 9B are plan views schematically illustrating the power-source conductive pattern shown in FIG. 8.
Figure 9B:
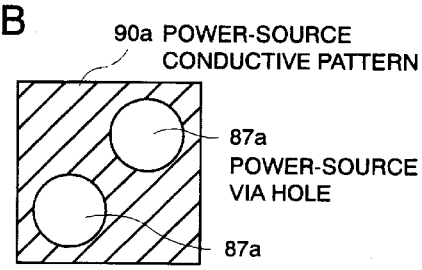
Figure 10A:
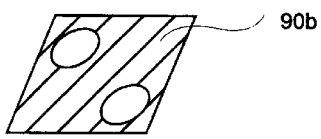
FIG. 10A and FIG. 10B are diagrams schematically illustrating the power-source conductive pattern arranged on each build-up layer.
Figure 10B:
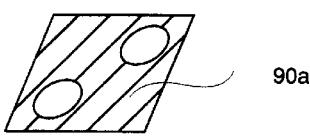

FIG. 9A is a plan view schematically illustrating the locations of power-source via holes opened in a power-source conductive pattern on the build-up layer. FIG. 9B is a plan view schematically illustrating the locations of power-source via holes opened in a power-source conductive pattern on the build-up layer. FIG. 10A is a perspective view schematically illustrating a power-source conductive pattern. FIG. 10B is a perspective view schematically illustrating a power-source conductive pattern.

Two power-source via holes 87a formed in the power-source conductive pattern 90b as well as two power-source via holes 87a formed in the power-source conductive pattern 90a are positioned so as not to be electrically connected to each other.

Figure 19:
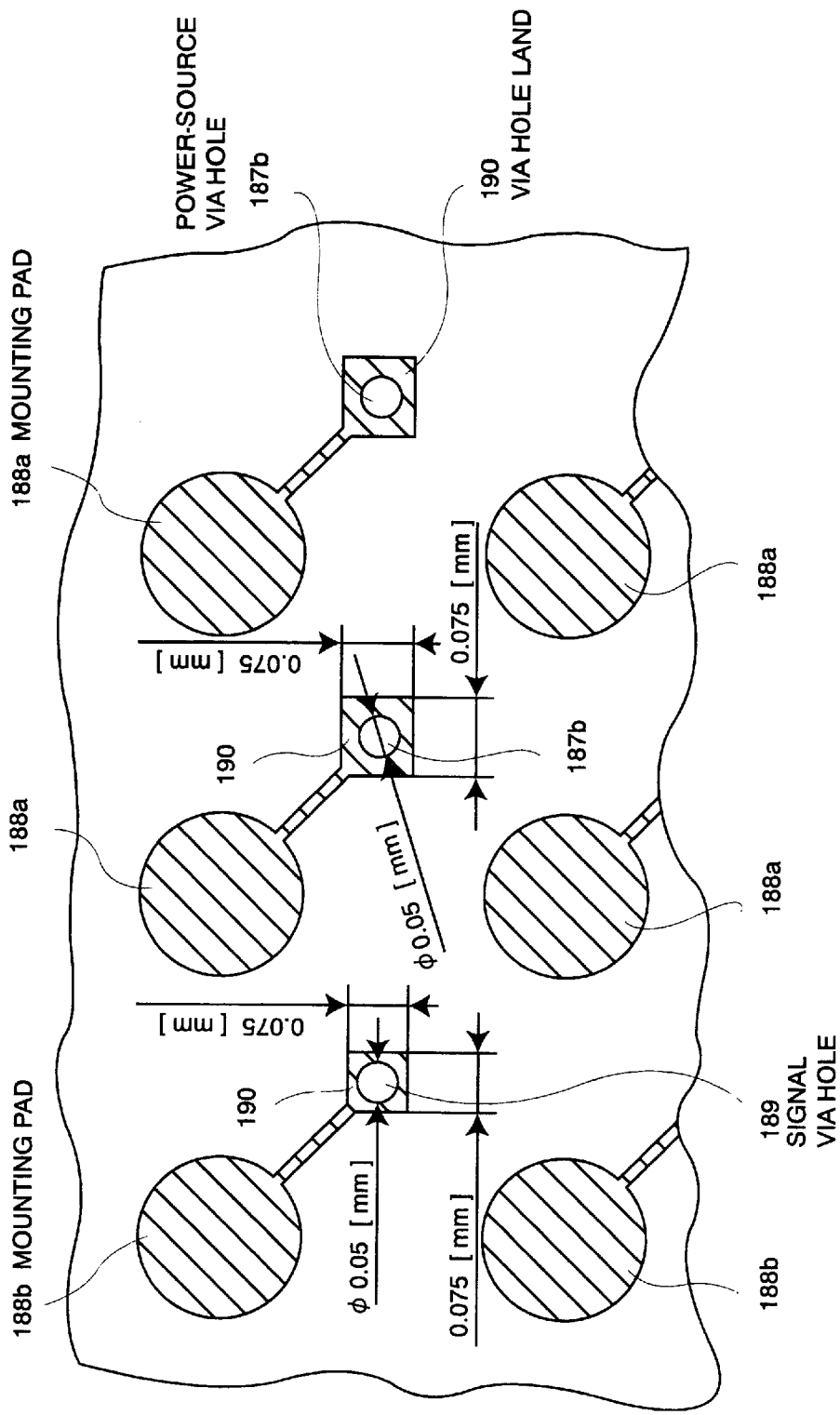

Two power-source via holes 87b are formed in the power-source conductive pattern 90b on the build-up layer 82b. This enables halving the electric resistance, compared with the single power-source via hole 187b formed in the via hole land 190 shown in FIG. 19.

Since the power-source via hole 87a and the power-source via hole 87b are positioned so as not to be connected to each other electrically, any communication between the power supply route for the build-up layer 82a and the power supply route for the build-up layer 82b does not achieved.

This embodiment employs round power-source via holes 87a and 87b. However, rectangular power-source via holes may be used, without being restricted to only the embodiment.

Moreover, the present embodiment employs the power-source via holes 87a and 87b and conductive patterns 90a and 90b. However, the ground via holes grounded and conductive patterns grounded may have a similar structure.

As described above, according to the present embodiment, an increased number of via holes for power supplying and grounding leads to reducing the electric resistance of a via hole.

First and second concrete embodiments are shown below. However, it should be noted that the present invention is not limited to these embodiments.

(First Embodiment)

Figure 11:
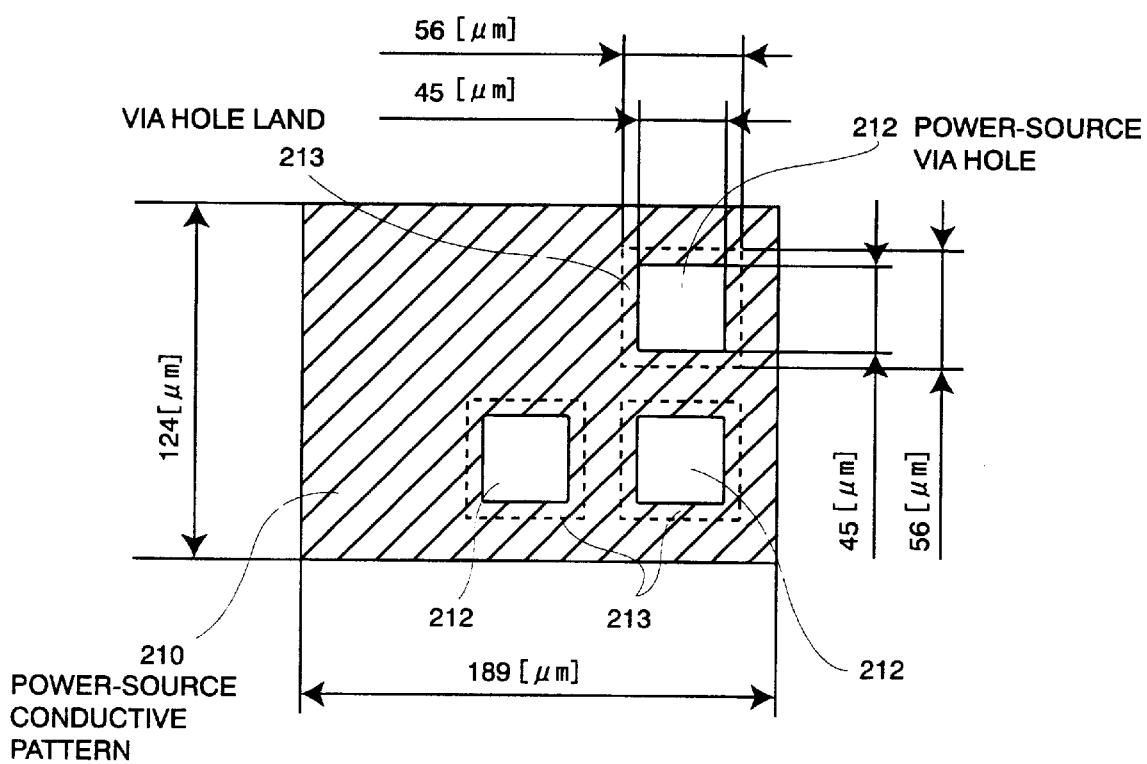
FIG. 11 is a diagram explaining dimensions of various portions of a power-source conductive pattern formed on a polyimide/ceramic multilayer wiring board according to the first embodiment of the present invention.
Figure 14:
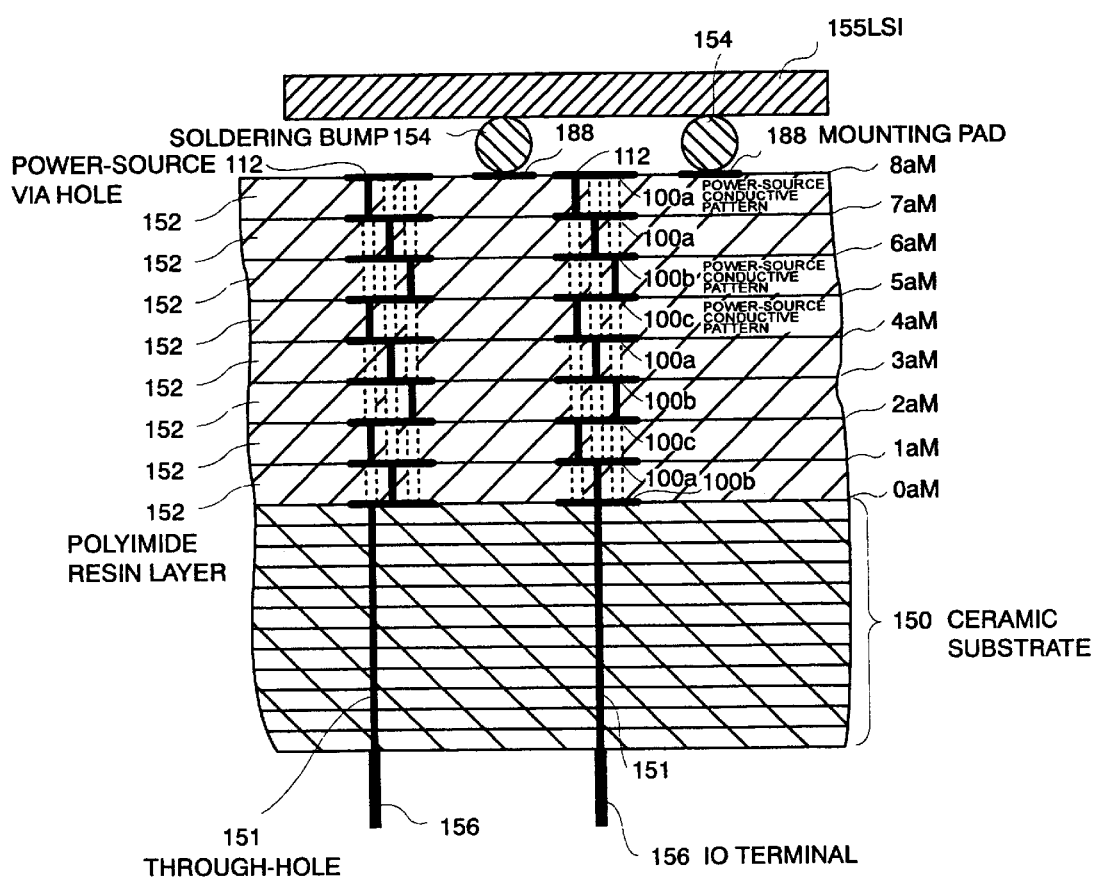
FIG. 14 is a cross-sectional view schematically illustrating a conventional polyimide/ceramic multilayer wiring board.
Figure 15:
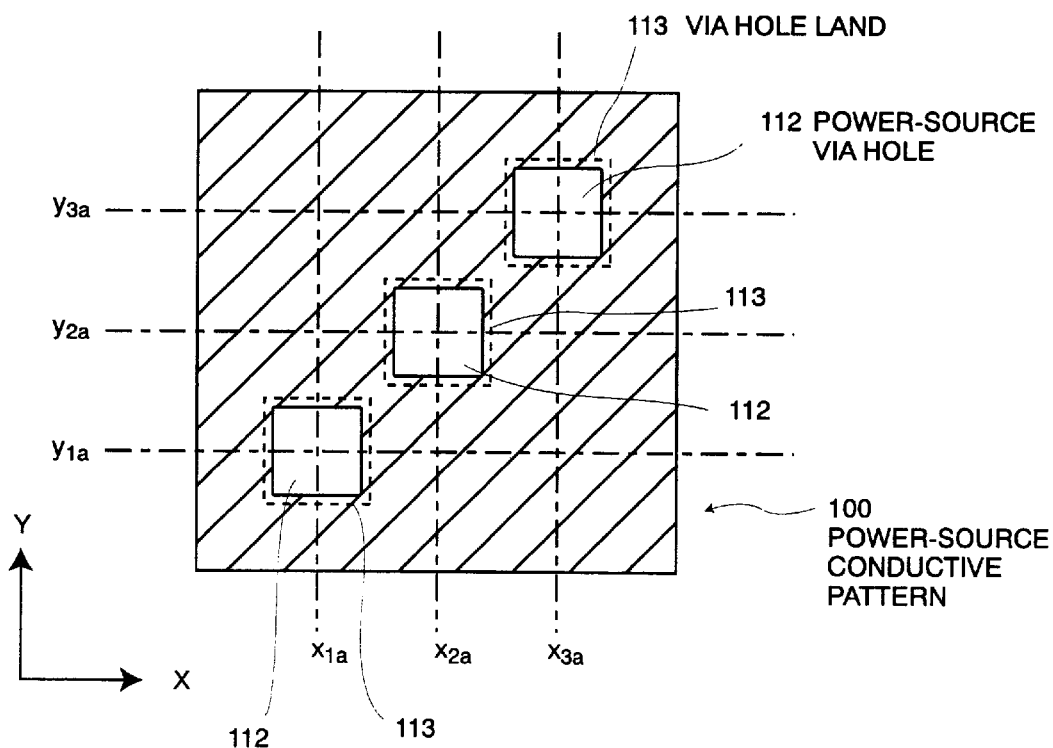
FIG. 15 is a plan view illustrating a conventional power-source conductive pattern.

The first embodiment of the present invention will be first described below. FIG. 11 shows dimensions of a power-source conductive pattern and dimensions of a power-source via hole and dimensions of a via hole land, in the present embodiment.

The power-source conductive pattern 210 has a rectangular form of 189 ($\mu$m)×124 ($\mu$m). The via hole land 213 has a square form of 56 ($\mu$m)×56 ($\mu$m). The power-source via hole 212 has rounded corners R and is of a square form of 45 ($\mu$m)×45 ($\mu$m).

In the present embodiment, the polyimide/ceramic multilayer wiring board has an area of 225 (mm$^2$) and carries 7×6 LSIs each of which each side has 25 power supply terminals.

Since 25 power-source conductive patterns 210 are formed corresponding to 25 power-source conductive patterns 210 of the LSI, the number of wiring channels is increased by 25. This means that the line length of 35 (m) per signal layer is increased so that the effective wiring length is increased about 8 (%).

(Second Embodiment)

Next, the second embodiment of the present invention will be described below.

The present embodiment uses the build-up board shown in FIGS. 7 and 8. Like numerals are attached to the same constituent elements as those shown in FIGS. 7 and 8.

FIG. 12A shows the dimensions of a mounting pad and the dimensions of a power-source conductive pattern, formed on the build-up layer. FIG. 12B shows the dimensions of a power-source conductive pattern formed on the build-up layer.

The mounting pad has a diameter of 0.25 (mm). The power-source conductive pattern 90b has a square form of 0.2×0.2 (mm). Two power-source via holes 87b of a diameter of 0.05 (mm) are respectively formed on the upper left and the lower right within the power-source conductive pattern 90b. The power-source via hole 87a of a diameter of 0.05 (mm) is formed on the upper right and the lower left within the power-source conductive pattern 90a.

FIG. 13 shows the spacing between mounting pads arranged on a build-up layer. The mounting pads 88a and 88b are arranged at intervals of 0.5 (mm).

According to the present embodiment, the power-source via holes 87a and 87b are formed so as not to be aligned with each other at the projection position. Hence, the power supply route for the build-up layer 82a and the build-up layer 82b can be provided differently. Moreover, two power-source via holes 87a are formed in a power-source conductive pattern while two power-source via holes 87b are formed in a power-source conductive pattern. This arrangement enables the electric resistance to be reduced, compared with the power-source via hole 187b shown in FIG. 19.

As described above, according to the multiple wiring board according to the present invention, the rectangular conductive pattern with via holes is arranged between wiring patterns while the long side thereof is oriented substantially in the direction of the wiring patterns. For that reason, the area occupied by each conductive pattern in the arrangement direction of wiring patterns is small, compared with the area occupied by the conventional square conductive pattern. The extra areas, not occupied by the conductive patterns and via holes, can be utilized as wiring-pattern forming areas, thus resulting in an increased number of wiring channels.

Moreover, the increased number of via holes for power supplying and grounding can reduce the electric resistance of the via hole.

What is claimed is:

1. A multilayer wiring board, comprising:

a first wiring layer having a first wiring pattern having conductors extending principally in a first direction;

a second wiring layer having a second wiring pattern having conductors extending principally in a second direction;

the first wiring direction of said first wiring pattern and the second wiring direction of said second wiring pattern being substantially perpendicular to each other, said first wiring layer and said second wiring layer being laminated; and power or ground connections formed of conductive patterns and vias in via holes and extending through said first and second wiring layers, said power or ground connections comprising:

a plurality of conductive patterns formed on each of said first and second wiring layers in such a way that each of the long sides is oriented substantially in the same direction of said wiring pattern formed on each wiring layer, respectively, each of said conductive patterns in alignment with a plurality of said via holes, each of said conductive patterns having a nearly rectangular form.

2. The multilayer wiring board defined in claim 1, wherein a position at which each via hole in each of said conductive patterns formed on said first wiring layer is projected is not aligned with a position at which each via hole in each of said conductive patterns formed on said second wiring layer.

3. The multilayer wiring board defined in claim 1,
wherein a long side of each of said conductive patterns corresponds to the length along which at least three via holes can be formed and wherein a short side of each of said conductive patterns corresponds to the length along which at least two via holes can be formed.

4. The multilayer wiring board defined in claim 3,
wherein at least two via holes are formed in each of said conductive patterns.

5. A multilayer wiring board, comprising:
a first wiring layer having a first wiring pattern having conductors extending principally in a first direction;
a second wiring layer having a second wiring pattern having conductors extending principally in a second direction;
the first wiring direction of said first wiring pattern and the second wiring direction of said second wiring pattern being substantially perpendicular to each other, said first wiring layer and said second wiring layer being laminated; and
power or ground connections formed of conductive patterns and vias in via holes and extending through said first and second wiring layers, said power or ground connections comprising:
a plurality of conductive patterns formed on each of said first and second wiring layers in such a way that each of the long sides is oriented substantially in the same direction of said wiring pattern formed on each wiring layer, respectively, each of said conductive patterns being formed in alignment with a plurality of said via holes, each of said conductive patterns having a nearly rectangular form; and
wherein a position at which each via hole in each of said conductive patterns formed on said first wiring layer is projected is not aligned with a position at which each via hole is formed in each of said conductive patterns formed on said second wiring layer.

6. The multilayer wiring board defined in claim 5,
wherein a long side of each of said conductive patterns corresponds to the length along which at least three via holes can be formed and wherein a short side of each of said conductive patterns corresponds to the length along which at least two via holes can be formed.

7. The multilayer wiring board defined in claim 6,
wherein at least two via holes are formed in each of said conductive patterns.

8. A multilayer wiring board, comprising:
a first wiring layer having a first wiring pattern having conductors extending principally in a first direction;
a second wiring layer having a second wiring pattern having conductors extending principally in a second direction;
the first wiring direction of said first wiring pattern and the second wiring direction of said second wiring pattern being substantially perpendicular to each other, said first wiring layer and said second wiring layer being laminated; and
power or ground connections formed of conductive patterns and vias in via holes and extending through said first and second wiring layers, said power or ground connections comprising:
a plurality of conductive patterns formed on each of said first and second wiring layers in such a way that each of the long sides is oriented substantially in the same direction of said wiring pattern formed on each wiring layer, respectively, each of said conductive patterns being formed in alignment with a plurality of said via holes, each of said conductive patterns having a nearly rectangular form; and
wherein a position at which each via hole in each of said conductive patterns formed on said first wiring layer is projected is not aligned with a position at which each via hole is formed in each of said conductive patterns formed on said second wiring layer; and
wherein a long side of each of said conductive patterns corresponds to the length along which at least three via holes can be formed and wherein a short side of each of said conductive patterns corresponds to the length along which at least two via holes can be formed.

9. The multilayer wiring board defined in claim 8, wherein at least two via holes are formed in each of said conductive patterns.

10. A multilayer wiring board comprising:
a first wiring layer and a second wiring layer laminated to each other;
a plurality of first conductive patterns arranged on said first wiring layer, each of said plurality of first conductive patterns having a plurality of power-source via holes; and
a plurality of second conductive patterns arranged on said second wiring layer, each of said plurality of second conductive patterns having a plurality of power-source via holes at positions which are not aligned with positions where said via holes in said first pattern are projected.

11. A multilayer wiring board, comprising:
a first wiring layer and a second wiring layer laminated to each other;
a plurality of first conductive patterns arranged on said first wiring layer, each of said plurality of first conductive patterns having a plurality of grounding via holes; and
a plurality of second conductive patterns arranged on said second wiring layer, each of said plurality of second conductive patterns having a plurality of grounding via holes at positions which are not aligned with positions where said via holes in said first pattern are projected.

12. A multilayer wiring board, comprising:
a first wiring layer having a first wiring pattern having conductors extending principally in a first direction;
a second wiring layer having a second wiring pattern having conductors extending principally in a second direction;
the first wiring direction of said first wiring pattern and the second wiring direction of said second wiring pattern being substantially perpendicular to each other, said first wiring layer and said second wiring layer being laminated; and
power or ground connections formed of conductive patterns and vias in via holes and extending through said first and second wiring layers, a said power or ground connection comprising:
a generally rectangular conductive pattern sized to correspond to a plurality of via hole positions in a matrix, via holes being formed at less than all said via hole positions, wherein at least one via hole formed in said first wiring layer is not aligned with a via hole in said second wiring layer and wherein a number of via hole positions in one coordinate direction of said matrix does not exceed two via hole positions.

13. A multilayer wiring board as recited in claim 12, wherein said conductive pattern is substantially square and said via holes are positioned such that no via hole formed in said first wiring layer is aligned with a via hole formed in said second layer.

14. A multilayer wiring board as recited in claim 12, wherein a long side of said rectangular conductive patterns in said first and second wiring layers extends in the same direction as the principal direction of said wiring pattern in each of said first and second wiring layers, respectively.

* * * * *